US010435781B2

(12) United States Patent
Kobayashi

(10) Patent No.: US 10,435,781 B2
(45) Date of Patent: Oct. 8, 2019

(54) SUBSTRATE PROCESSING APPARATUS, SUBSTRATE PROCESSING METHOD AND NON-TRANSITORY STORAGE MEDIUM

(71) Applicant: TOKYO ELECTRON LIMITED, Tokyo (JP)

(72) Inventor: Shinji Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 339 days.

(21) Appl. No.: 15/178,084

(22) Filed: Jun. 9, 2016

(65) Prior Publication Data

US 2016/0281213 A1 Sep. 29, 2016

Related U.S. Application Data

(62) Division of application No. 13/719,612, filed on Dec. 19, 2012, now Pat. No. 9,388,931.

(30) Foreign Application Priority Data

Dec. 28, 2011 (JP) .................. 2011-289676

(51) Int. Cl.
*H01L 21/67* (2006.01)
*C23C 14/24* (2006.01)
*H01L 21/677* (2006.01)

(52) U.S. Cl.
CPC ........ *C23C 14/24* (2013.01); *H01L 21/67748* (2013.01); *Y10T 137/0318* (2015.04); *Y10T 137/794* (2015.04)

(58) Field of Classification Search
CPC ......... H01L 21/67155; H01L 21/67161; H01L 21/67167; H01L 21/67173;
(Continued)

(56) References Cited

U.S. PATENT DOCUMENTS 4,524,719 A * 6/1985 Campbell ............. C23C 16/481
 118/719
4,539,933 A * 9/1985 Campbell ............. C23C 16/481
 118/719
(Continued)

FOREIGN PATENT DOCUMENTS

JP 4328667 B2 9/2009

OTHER PUBLICATIONS

DeLuca, Giovanna, et al., Solvent vapour annealing of organic thin films: controlling the self-assembly of functional systems across multiple length scales:. Journal of material Chemistry, 2010, 20. 2493-2498.

(Continued)

*Primary Examiner* — Rudy Zervigon
(74) *Attorney, Agent, or Firm* — Nath, Goldberg & Meyer; Jerald L. Meyer

(57) ABSTRACT

There is provided a substrate processing apparatus to perform a predetermined process on a substrate on which a pattern mask is formed, comprising a compartment mechanism configured to switch between a compartmented state and an open state. The compartmented state includes a first section having the evaporation source formation part, and a second section configured to transfer the substrate between an outside of processing vessel and a mounting table. The substrate processing apparatus comprises a substrate transfer hole formed in the processing vessel and configured to open and close with respect to the second section being in the compartmented state; and an exhaust hole formed to connect to the second section and configured to exhaust the second section in the compartment state to remove a solvent atmosphere of the second section.

9 Claims, 19 Drawing Sheets

(58) Field of Classification Search
CPC ......... H01L 21/67178; H01L 21/67184; H01L 21/6719; H01L 21/67196; H01L 21/67201; H01L 21/67748; C23C 14/24; Y10T 137/0318; Y10T 137/794
USPC ..................................... 118/719; 156/345.31
See application file for complete search history.

(56) References Cited

U.S. PATENT DOCUMENTS

| | | | | |
|---|---|---|---|---|
| 4,545,327 | A * | 10/1985 | Campbell | C23C 16/481 |
| | | | | 118/719 |
| 4,895,107 | A * | 1/1990 | Yano | C23C 16/4409 |
| | | | | 118/719 |
| 5,820,683 | A * | 10/1998 | Ishii | H01L 21/67309 |
| | | | | 118/728 |
| 6,312,971 | B1 | 11/2001 | Amundson | |
| 6,589,338 | B1 | 7/2003 | Nakamori | |
| 6,605,153 | B2 * | 8/2003 | Kitano | B05C 5/0212 |
| | | | | 118/57 |
| 6,780,251 | B2 * | 8/2004 | Tometsuka | C23C 16/4583 |
| | | | | 118/725 |
| 6,852,167 | B2 * | 2/2005 | Ahn | C23C 16/45525 |
| | | | | 118/715 |
| 7,171,973 | B2 * | 2/2007 | Orii | C03C 23/0075 |
| | | | | 134/148 |
| 7,993,457 | B1 * | 8/2011 | Krotov | C23C 16/45544 |
| | | | | 118/719 |
| 8,375,891 | B2 * | 2/2013 | Nagata | H01F 41/0293 |
| | | | | 118/719 |
| 9,028,614 | B2 * | 5/2015 | Hara | C30B 25/08 |
| | | | | 118/724 |
| 9,388,931 | B2 * | 7/2016 | Kobayashi | H01L 21/67748 |
| 2001/0019387 | A1 | 9/2001 | Nakasogi | |
| 2002/0122885 | A1 * | 9/2002 | Ahn | C23C 16/45525 |
| | | | | 427/255.28 |
| 2003/0207032 | A1 * | 11/2003 | Ahn | C23C 16/4412 |
| | | | | 427/255.34 |
| 2004/0001921 | A1 | 1/2004 | Kolb | |
| 2004/0099213 | A1 * | 5/2004 | Adomaitis | C23C 16/4412 |
| | | | | 118/715 |
| 2004/0144754 | A1 | 7/2004 | Itami | |
| 2005/0011537 | A1 | 1/2005 | Toshima | |
| 2005/0173838 | A1 | 8/2005 | Priedeman, Jr. | |
| 2005/0186716 | A1 * | 8/2005 | Kasumi | H01L 21/67201 |
| | | | | 438/149 |
| 2007/0195853 | A1 * | 8/2007 | Park | C23C 16/46 |
| | | | | 374/1 |
| 2009/0137103 | A1 * | 5/2009 | Yamazaki | H01L 21/67161 |
| | | | | 438/479 |
| 2009/0169342 | A1 * | 7/2009 | Yoshimura | H01L 21/67772 |
| | | | | 414/217 |
| 2009/0269933 | A1 * | 10/2009 | Yamaguchi | C23C 16/4584 |
| | | | | 438/706 |
| 2010/0276324 | A1 * | 11/2010 | Hyobu | H01L 21/67346 |
| | | | | 206/449 |
| 2011/0212599 | A1 * | 9/2011 | Kuribayashi | C23C 16/325 |
| | | | | 438/478 |
| 2011/0297085 | A1 | 12/2011 | Matsuyama | |
| 2012/0000425 | A1 * | 1/2012 | Park | C23C 16/45565 |
| | | | | 118/724 |
| 2012/0220108 | A1 * | 8/2012 | Hara | C30B 25/08 |
| | | | | 438/478 |
| 2013/0000757 | A1 * | 1/2013 | Yoshimura | H01L 21/67772 |
| | | | | 137/561 R |
| 2013/0167936 | A1 * | 7/2013 | Kobayashi | H01L 21/67748 |
| | | | | 137/1 |
| 2014/0178162 | A1 * | 6/2014 | Morikawa | H01L 21/67265 |
| | | | | 414/416.08 |
| 2016/0027672 | A1 * | 1/2016 | Asakawa | H01L 21/67126 |
| | | | | 438/706 |
| 2016/0329220 | A1 * | 11/2016 | Nakai | H01L 21/67051 |
| 2017/0073813 | A1 * | 3/2017 | Hyon | C23C 16/45578 |
| 2018/0315626 | A1 * | 11/2018 | Franklin | H01L 21/67103 |

OTHER PUBLICATIONS

Yu, Jie, et al., "Preparation of High-Quality Colloidal Mask for Nanosphere Lithography by a Combination of Air/Water Interface Self-Assembly and Solvent Vapor Annealing", Langmuir, 2012, 28, 12681-12689.

Jung, Yeon Sik, et al., "Orientation-Controlled Self-Assembled Nanolithography Using a Polystyrene-Polydimethylsiloxane Block Copolymer", NanoLetters, 2007, vol. 7, No. 7, 2046-2050.

* cited by examiner

SUBSTRATE PROCESSING APPARATUS, SUBSTRATE PROCESSING METHOD AND NON-TRANSITORY STORAGE MEDIUM

CROSS-REFERENCE TO RELATED APPLICATION

This is a Divisional Application of U.S. patent application Ser. No. 13/719,612, claiming the benefit of Japanese Patent Application No. 2011-289676, filed on Dec. 28, 2011, in the Japan Patent Office, the content of each which is incorporated herein in its entirety.

TECHNICAL FIELD

The present disclosure relates to a substrate processing apparatus, a substrate processing method and a non-transitory storage medium, for improving roughness of a pattern mask.

BACKGROUND

When manufacturing semiconductor devices, LCD (Liquid Crystal Device) substrates or the like, a predetermined pattern mask is formed on a semiconductor wafer (hereinafter, referred to "wafer") by applying a resist liquid on the surface of the wafer, exposing the wafer and developing the wafer. It has been conventionally known that fine asperities are formed on the surface of a resist pattern after the development process, which may have an undesirable effect on a pattern line width when a subsequent etching process is performed. In order to resolve the above problem, a smoothing process has been proposed to improve a line edge roughness (LER) or a line width roughness (LWR) of the resist pattern.

This smoothing process is performed by forming an atmosphere of a solvent vapor to be used to dissolve the resist in a processing vessel, exposing the resist pattern to the atmosphere, and swelling a surface layer portion of the resist pattern. By performing the smoothing process, the surface layer portion is dissolved by the solvent and is smoothed. As a result, the surface roughness of the resist pattern is improved and the shape of the pattern is corrected.

In the above described smoothing process, however, other wafers that are in queue outside the processing vessel may be affected by proximity to the processing vessel. Thus, there is a need to fully exhaust the interior of the processing vessel and reduce a concentration of the remaining solvent to a predetermined reference value or less, in order to contain the effect on the other wafers, before a subsequent wafer to be processed is carried into the processing vessel after the processing vessel is opened and a processed wafer is carried out. However, such an exhaust process requires a considerable amount of time, which causes deterioration in throughput. The problem of throughput deterioration during the exhaust process has not been resolved in the conventional technique.

SUMMARY

The present disclosure provides a substrate processing apparatus and a substrate processing method for smoothing a surface of a pattern mask formed on a substrate, which is capable of preventing the leakage of the solvent from a processing vessel and the deterioration of throughput.

According to one embodiment of the present disclosure, a substrate processing apparatus to perform a predetermined process on a substrate on which a pattern mask is formed by exposure and development treatments, comprising: a processing vessel having a process space; a mounting table installed in the process space and configured to mount the substrate thereon; a heating part configured to heat the substrate mounted on the mounting table to a temperature higher than a dew-point temperature of a solvent; an evaporation source formation part installed in the process space, the evaporation source formation part configured to supply the solvent to process the substrate in a saturated vapor atmosphere of the solvent within the process space; a compartment mechanism configured to switch between a compartmented state and an open state, wherein the compartmented state includes a first section having the evaporation source formation part installed in the process space, and a second section configured to transfer the substrate between the outside of the processing vessel and the mounting table, wherein the compartmented state represents a state where the first section and the second section are partitioned such that atmospheres of the first and second sections are blocked from each other, and wherein the open state represents a state where the atmospheres of the first and second sections are opened to each other; a substrate transfer hole formed in the processing vessel and configured to open and close with respect to the second section being in the compartmented state; and an exhaust hole formed to connect to the second section and configured to exhaust the second section in the compartment state to remove a solvent atmosphere of the second section.

According to another embodiment of the present disclosure, a substrate processing method of performing a predetermined process onto a substrate, on which a pattern mask is formed by exposure and development treatments, comprising: mounting the substrate on a mounting table installed in a process space formed in a processing vessel; heating the substrate mounted on the mounting table by a heating part to a temperature higher than a dew-point temperature of a solvent; evaporating the solvent from an evaporation source formation part installed in the process space opposite to the entire surface of the substrate to form an internal atmosphere of the process space to a saturated vapor atmosphere of the solvent; forming a compartmented state by a compartment mechanism; the compartmented state representing a state that a first section, in which the evaporation source formation part is installed in the process space, and a second section for transferring the substrate between the outside of the processing vessel and the mounting table, are partitioned such that atmospheres of the first and second sections are blocked from each other; forming an open state by compartment mechanism, the open state representing a state that the atmospheres of the first and second sections are opened to each other; and exhausting the second section when in the compartmented state and removing a solvent atmosphere of the second section.

According to yet another embodiment of the present disclosure, a non-transitory computer-readable storage medium for use in a substrate processing apparatus which performs a predetermined process to a substrate on which a pattern mask is formed by exposure and development treatments, the storage medium storing a computer program for causing a computer to execute the substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
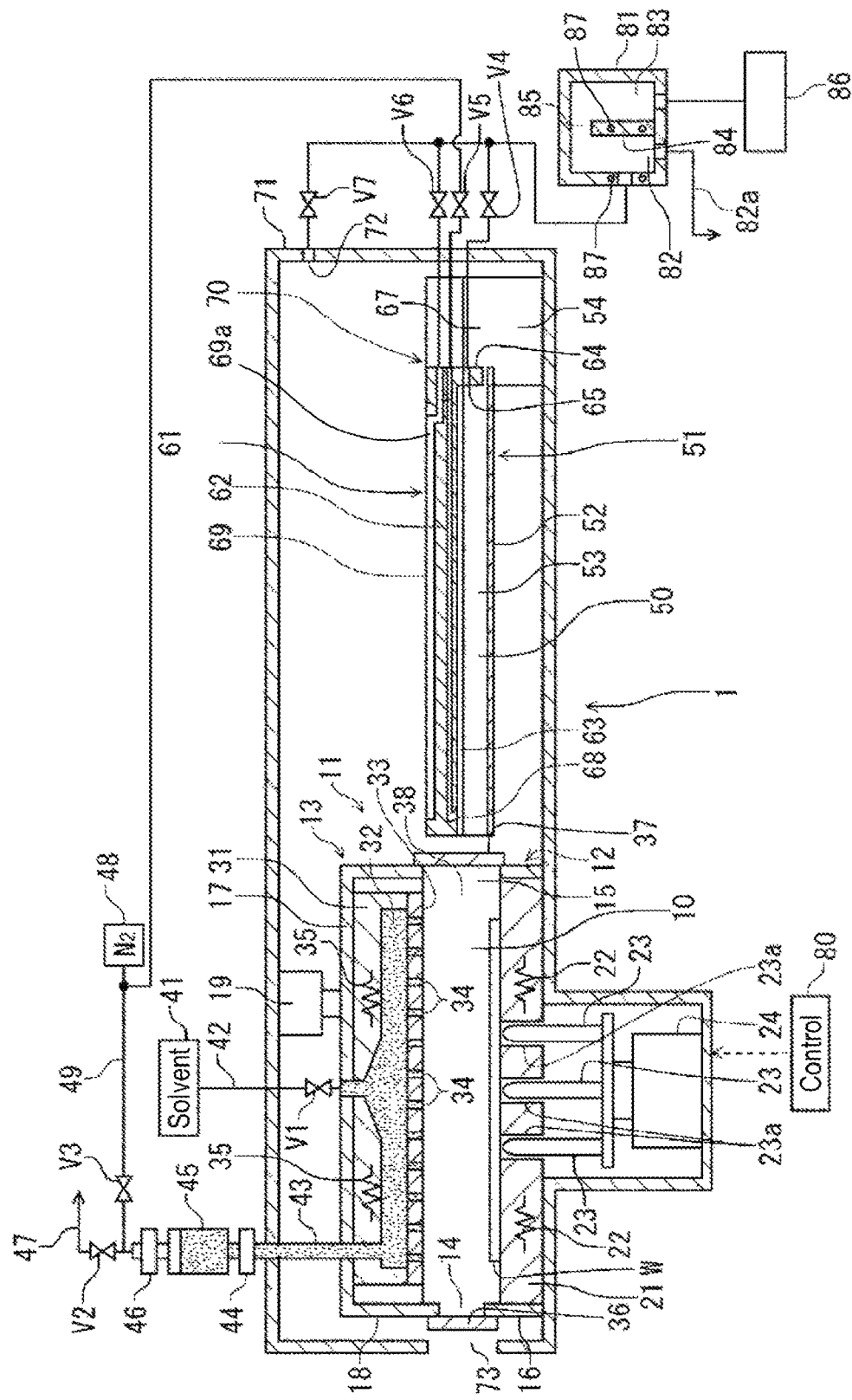
FIG. 1 shows a longitudinal sectional view of a substrate processing apparatus according to some embodiments.
Figure 2:
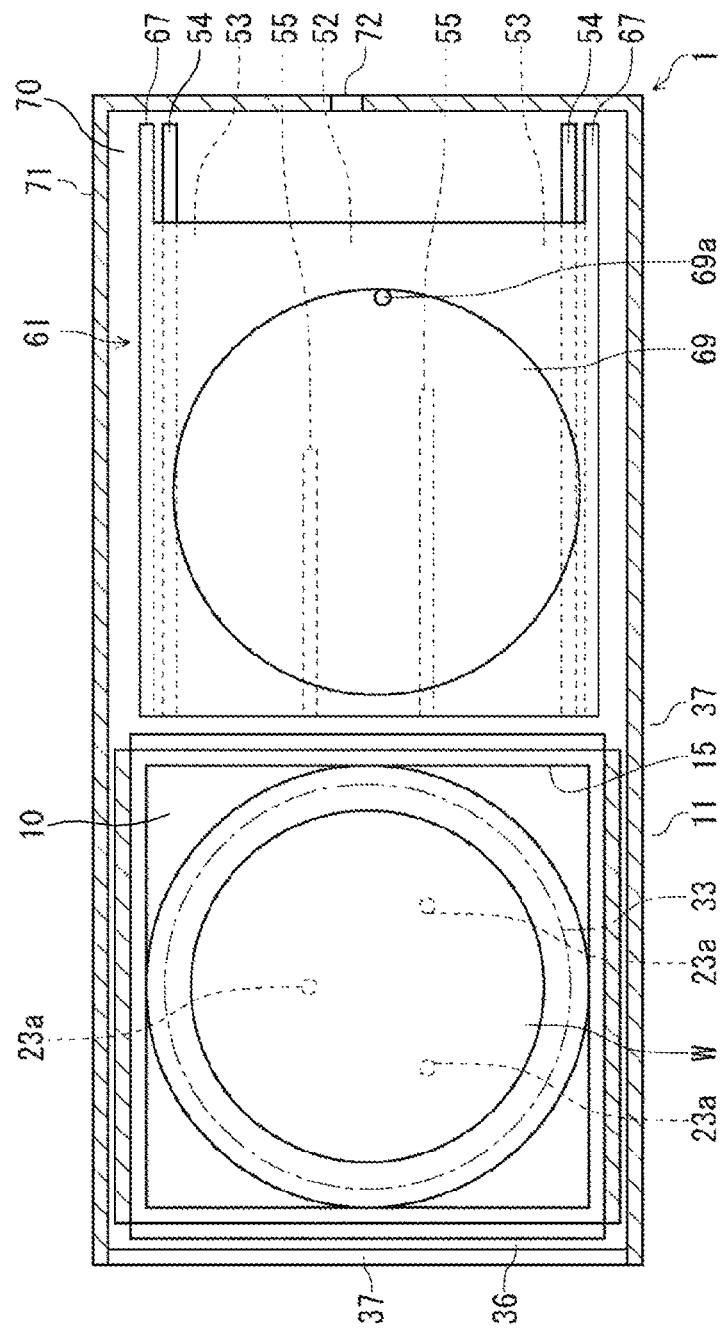
FIG. 2 is shows a traverse sectional view of the substrate processing apparatus shown in FIG. 1.

Hereafter, a substrate processing apparatus 1 as shown in FIGS. 1 and 2, according to some embodiments, will be described with reference to the accompanying drawings. The substrate processing apparatus 1 is configured to perform a surface treatment to a wafer W (a substrate), on which a resist pattern mask is formed by exposure and development processes, for improving roughness of the pattern mask. FIGS. 1 and 2 show longitudinal and traverse sectional views of the substrate processing apparatus 1, respectively. The substrate processing apparatus 1 comprises a processing vessel 11 configured to form a process atmosphere, a cooling arm 51 and an exhaust arm 61, both of which are capable of movement for advancing to and retreating from the processing vessel 11, and a housing 71.

Figure 3:
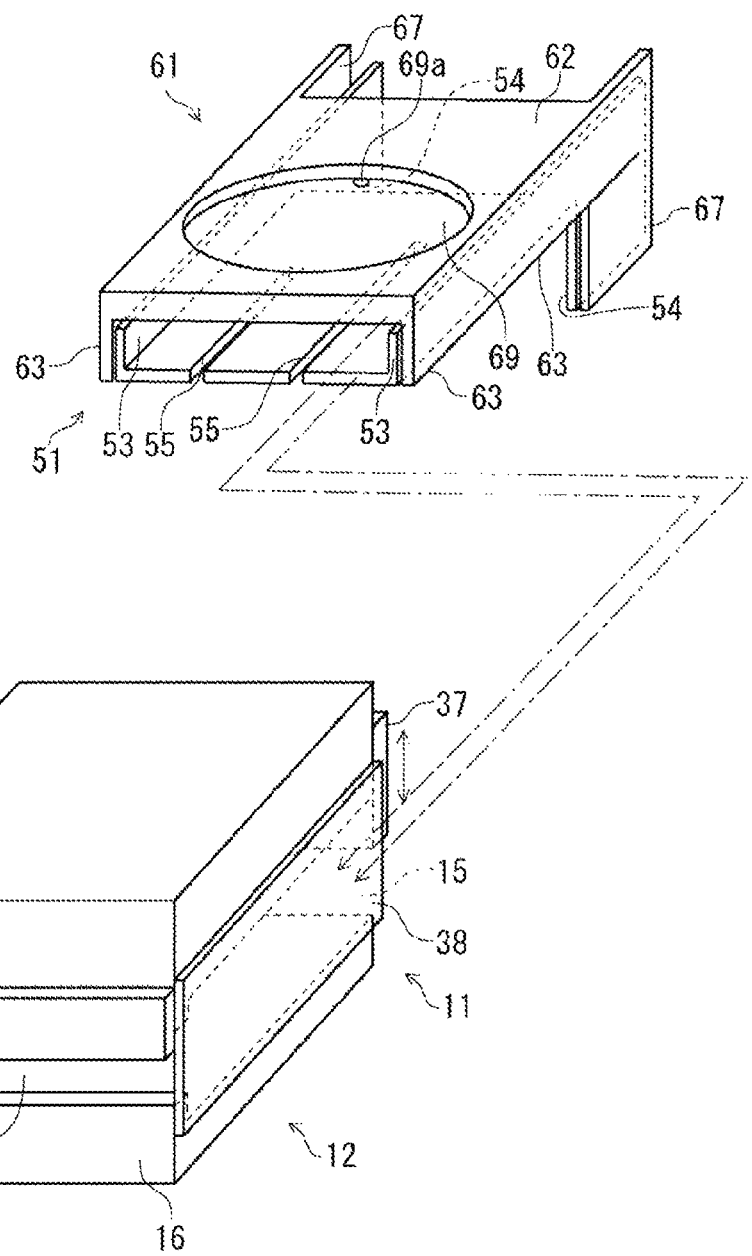
FIG. 3 shows a schematic perspective view of a processing vessel, a cooling arm and an exhaust arm, which are installed in the substrate processing apparatus, according to some embodiments.

As shown in a schematic perspective view in FIG. 3, the processing vessel 11 is formed, for example, into a flat rectangular shape, and the interior of the processing vessel 11 is formed to have a process space 10 for processing the wafer W. The processing vessel 11 is divided into an upper part and a lower part, where the lower part is a base 12 and the upper part is a cover 13. In a lateral side of the processing vessel 11 facing a wafer transfer path, a gap between the base 12 and the cover 13 is a transfer port 14 for transferring the wafer W. A gap between the base 12 and the cover 13 in a lateral side opposite to the transfer port 14 is an advance-retreat port (opening for movement) 15 through which the cooling arm 51 and the exhaust arm 61 are advanced to and retreated from the process space 10. For illustrative purpose, the transfer port 14 side is referred to as a forward side and the advance-retreat port 15 side is referred to as a backward side.

The base 12 comprises sidewalls 16 surrounding side portions of the process space 10 and a stage 21 as a bottom portion of the process space 10. The stage 21 for use as a process mounting table is surrounded by the sidewalls 16 and is horizontally formed. The sidewall 16 in the forward side about the stage 21 is formed to be higher than the surface of the stage 21 such that the leading end portion (the forward portion) of the cooling arm 51 coming into the processing vessel 11 can be brought into contact with the sidewall 16 in the forward side.

The stage 21 is includes heaters 22 (heating part) therein configured to heat the wafer W mounted on the stage 21 to a temperature that is higher than a dew-point temperature of a solvent and lower than a boiling point of the solvent (which will be described later). Further, the stage 21 includes three holes 23a perforated in a thickness direction of the stage 21 and three elevating pins 23 inserted into and passed through the holes 23a. Leading ends of the elevating pins 23 are moved upward and downward on the surface of the stage 21 by an elevating mechanism 24. The elevating pins 23 and the elevating mechanism 24 constitutes a mount and transfer mechanism for the wafer W.

The cover 13 includes a ceiling wall 17 of the processing vessel 11 and sidewalls 18 surrounding side portions of the process space 10. In the sidewalls 18, the sidewall 18 on the forward side is formed to be lower than a solvent holding plate 33 (which will be further described later) such that the leading end side of the exhaust arm 61 coming into the processing vessel 11 is in contact with the sidewall 18 in the forward side. The cover 13 is configured to be moved upward and downward by an elevating mechanism 19.

A shutter 36 is installed at the sidewall 18 of the cover 13 in the forward side. The shutter 36 is movable upward and downward with respect to the cover 13 to open and close the transfer port 14. Further, a shutter 37 is installed at the sidewall 18 of the cover 13 in the backward side. The shutter 37 is movable upward and downward with respect to the cover 13 to open and close the advance-retreat port 15. Block plates 38 are installed in left and right sides of the cover 13 and extend downwardly. The block plates 38 are vertically moved with the cover 13 to block gaps between the cover 13 and the base 12 in the left and right sides of the processing vessel 11 and to prevent an internal atmosphere of the process space 10 from leaking from the left and right sides of the processing vessel 11 when the cover 13 is moved upwards and downwards.

In the ceiling wall 17, a flat circular flow path forming part 31 is formed to be surrounded by the sidewalls 18. A circular recess is formed below the flow path forming part 31. The recess constitutes a solvent supply region 32. The solvent holding plate 33, which is an evaporation source formation member, is configured to cover the bottom of the solvent supply region 32.

The lower surface of the solvent holding plate 33 constitutes an opposite portion facing the wafer W on the stage 21. In the solvent holding plate 33, a plurality of solvent supply holes 34 are formed to be spaced apart from each other. The solvent supply holes 34 are perforated in a thickness direction of the solvent holding plate 33. Solvent supplied to the solvent supply region 32 is spread to the lower surface of the solvent holding plate 33 through each solvent supply hole 34 by a capillary action. The spread solvent is volatilized and evaporated in a region opposed to the entire surface of the wafer W as seen from the wafer W on the stage 21 so that the wafer W is entirely exposed to the vapor of the solvent. In order to supply the solvent vapor to the entire surface of the wafer W as described above, the solvent holding plate 33 is formed to have a planar shape larger than that of the wafer W. The diameter of each solvent supply hole 34 is, for example, about 0.3 mm to 1 mm. In the flow path forming part 31, heaters 35 are provided as a heating part. The temperature of the solvent holding plate 33 is controlled by the heaters 35 at a high uniformity through the solvent supply region 32. As a result, the solvent spreading downwardly through the solvent supply holes 34 is volatilized at a high uniformity in the surface of the solvent holding plate 33 and the solvent vapor is supplied to the wafer W at a high uniformity, as explained above.

Also shown in FIG. 1 is a solvent supply source 41 in which the solvent is stored. The solvent supply source 41 supplies the solvent to the solvent supply region 32 through a solvent supply pipe 42. In FIG. 1, V1 represents a valve disposed in the solvent supply pipe 42. An opening/closing of the valve V1 is controlled by a control unit 80 (which will be further described later) such that supplying and blocking operations of the solvent to the solvent supply region 32 are controlled. Examples of the solvent may include, but is not limited to, an acetone, propylene glycol methyl ether acetate (PGMEA), cyclohexanone, Propylene glycol monomethyl ether (PGME), Gamma-Butyrolactone (GBL), pyridine, xylene, N-methyl-2-pyrrolidone (NMP), Ethyl lactate, 2-Heptanone, butyl acetate, methyl isobutyl ketone (MIBK), diethyl ether, anisole, Dimethyl sulfoxide (DMSO), m-Cresol, or the like, which has a function of dissolving a resist film.

A liquid level detection pipe 43 is vertically connected to the solvent supply region 32. In the liquid level detection pipe 43, a lower liquid level detecting sensor 44, a tank 45, and an upper liquid level detecting sensor 46 are subsequently disposed from the bottom to the top. The upper end of the liquid level detection pipe 43 is branched into a liquid drain pipe 47 connected to a liquid drain path, and a gas supply pipe 49 connected to an N2 gas supply source 48. In FIGS. 1, V2 and V3 represent a valve disposed in the liquid drain pipe 47 and a valve disposed in the gas supply pipe 49, respectively. As will be described later, when discarding the solvent, the valve V2 is closed to pressurize the liquid level detection pipe 43. However, the valve V2 is opened to supply the solvent from the solvent supply source 41 to the liquid level detection pipe 43 except for the discarding operation above. When discarding the solvent, the valve V3 is opened to supply the N2 gas from the N2 gas supply source 48 to the liquid level detection pipe 43. However, the Valve V3 is closed except for the discarding operation above. The valve V3, the gas supply pipe 49 and the N2 gas supply source 48 constitute a solvent exhaust mechanism.

Figure 4:
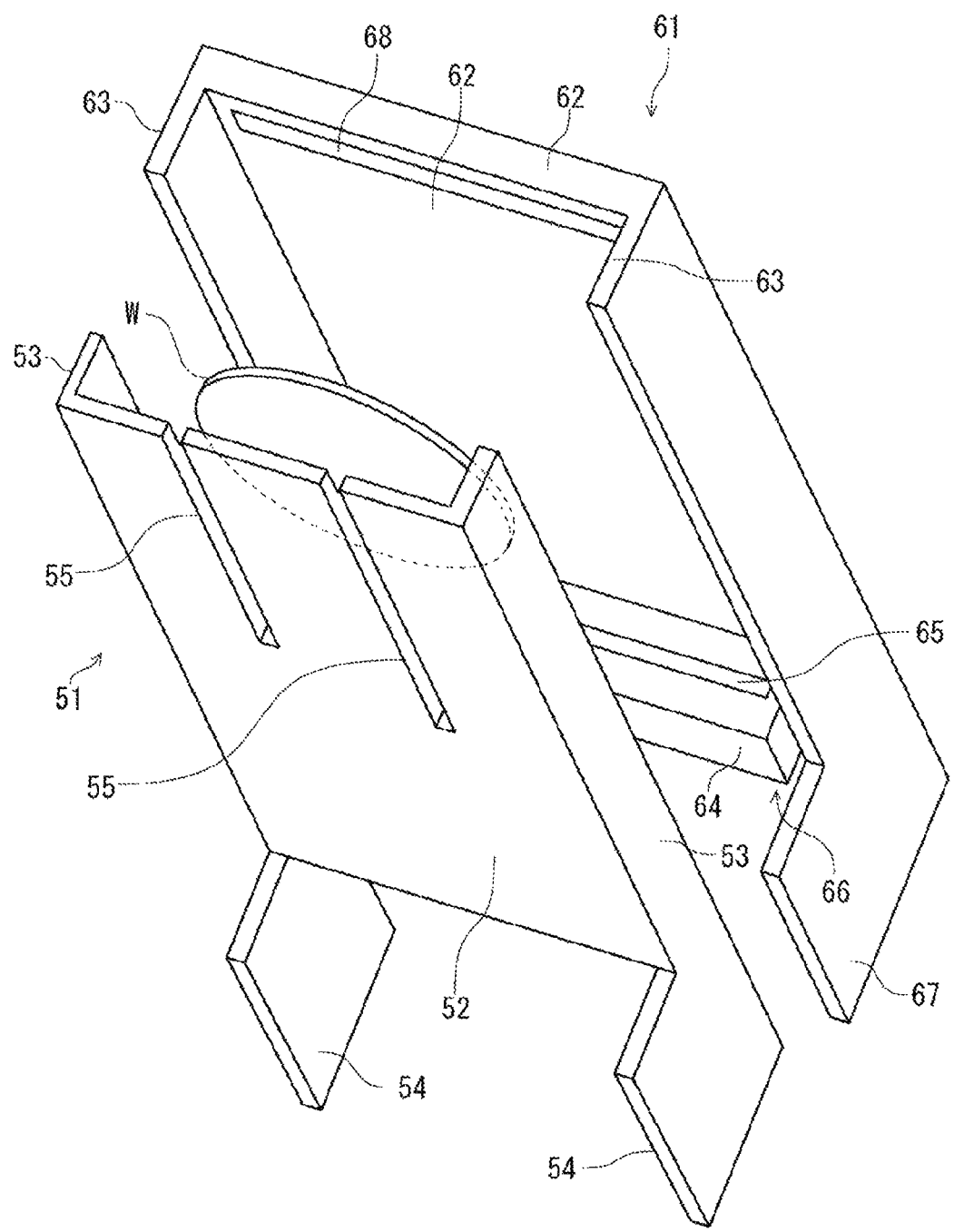
FIG. 4 shows a perspective view of each lower side of the cooling arm and the exhaust arm, which are installed in the substrate processing apparatus, according to some embodiments.
Figure 5:
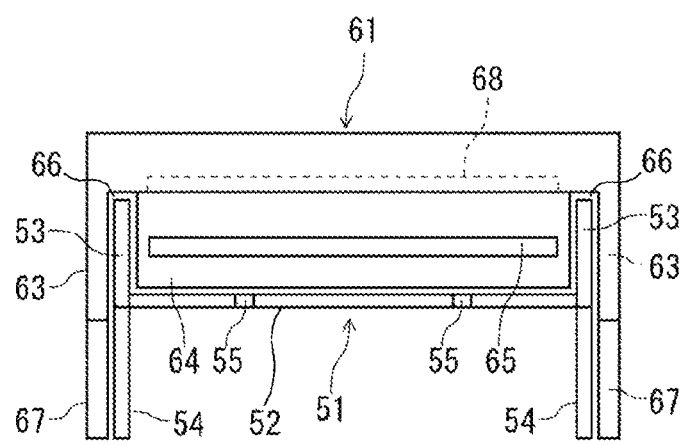
FIG. 5 shows a front view of the cooling arm and the exhaust arm, according to some embodiments.

Next, the cooling arm 51 and the exhaust arm 61 will be described with reference to FIGS. 4 and 5, showing a lower perspective view and a front view of the cooling arm 51 and the exhaust arm 61. The cooling arm 51 has a cooling plate 52 constituting a mounting portion for cooling. The cooling plate 52 is formed into a horizontal and rectangular shape. For example, a cooling water path (not shown) is formed inside the cooling plate 52, and the wafer W mounted on the surface of the cooling plate 52 is cooled by heat exchange with the cooling water. As shown in FIG. 5, when seen from a front-back direction, the left and right sides of the cooling plate 52 are bent upward to form upward-extended plates 53. Further, the left and right sides of the backward portion of the cooling plate 52 are extended downward to form support parts 54. The support parts 54 are connected to a drive mechanism (not shown). By the drive mechanism, the cooling arm 51 is movable in the frontward and backward directions between a standby section 70 in the rear side of the processing vessel 11 and the process space 10 of the processing vessel 11 (FIGS. 1 and 2). Two slits 55 are formed in parallel to extend from the front side to the back side of the cooling plate 52. When the cooling arm 51 advances into the process space 10, the elevating pins 23 may pass through the slits 55.

Next, the exhaust arm 61 constituting a compartment mechanism will be described. As shown in FIG. 3, the exhaust arm 61 is formed to cover the cooling arm 51 and includes a compartment plate 62 positioned above the cooling plate 52. The process space 10 is partitioned into an adjacent section 60 which is a space between the solvent holding plate 33 and the compartment plate 62, and an exhaust section 50 which is a space between the compartment plate 62 and the stage 21, when the exhaust arm 61 is positioned in the process space 10 (see FIG. 7). The compartment plate 62 is configured to be a horizontal and rectangular shape. As shown in FIG. 5, when seen from the front-back direction, the left and right sides of the compartment plate 62 are bent vertically downward to form downward-extended plates 63. The downward-extended plates 63 are formed to insert the cooling arm 51 between the left and right sides thereof. The downward-extended plates 63 and the upward-extended plates 53 of the cooling arm 51 are combined to form a flow path toward the exhaust section 50 as a curved structure, as seen from a solvent vapor of the adjacent section 60 (which will be further described later). This prevents the solvent vapor from coming into the exhaust section 50.

In the backward side of the compartment plate 62, an exhaust part 64 is disposed between the downward-extended plates 63. The exhaust part 64 is configured to block the backward side of the exhaust section 50 (where the exhaust section 50 is configured to be surrounded by the cooling plate 52 and the upward-extended plates 53 of the cooling arm 51 and the compartment plate 62) such that a position of the front end of the exhaust arm 61 and a position of the front end of the cooling arm 51 are aligned with each other. A slit-like exhaust hole 65 extending in a left-right direction is formed in the exhaust part 64, which makes it possible to exhaust and remove an internal atmosphere of the exhaust section 50. The exhaust hole 65 is connected to a tank 81 (which will be further described later) through a valve V4. As shown in FIGS. 4 and 5, gaps 66 are formed between the exhaust part 64 and the downward-extended plates 63 such that the upward-extended plates 53 of the cooling arm 51 can be passed through the gaps.

The back ends of the downward-extended plates 63 extend downward to form support parts 67. The support parts 67 are connected to a drive mechanism (not shown). By the drive mechanism, the exhaust arm 61 is movable in the forward and backward directions between the standby section 70 defined at the rear side of the processing vessel 11 and the process space 10 of the processing vessel 11 (FIG. 1). A slit-like purge gas discharging hole 68 extending in a left-right direction is formed at a front end portion of the lower surface of the compartment plate 62. The purge gas discharging hole 68 is formed to discharge the N2 purge gas to the inclined backward side of the exhaust section 50 for preventing a solvent atmosphere of the exhaust section 50 from flowing outside the processing vessel 11. The purge gas discharging hole 68 is connected to the N2 gas supply source 48 through valve V5.

A liquid-receiving portion 69 of a circular recess shape is formed at the upper surface of the compartment plate 62. When the exhaust arm 61 enters into the processing vessel 11, the liquid-receiving portion 69 is placed opposite to the lower side of the solvent holding plate 33, and serves to receive and remove unnecessary solvent discharged from the solvent holding plate 33 and serves to remove an atmosphere of the upper side of the compartment plate 62. For this reason, the liquid-receiving portion 69 is formed to be larger than the solvent holding plate 33. A waste channel 69a is connected to the liquid-receiving portion 69. Further, the waste channel 69a is connected to the tank 81 through a valve V6.

Referring back to FIGS. 1 and 2, the housing 71 is formed to surround the processing vessel 11 and the standby section 70 outside the processing vessel 11, where the cooling arm 51 and the exhaust arm 61 may be on stand by. An exhaust hole (or outer exhaust hole) 72 is formed at the rear side of the housing 71. When the shutter 37 is opened to provide an opening for the advance-retreat port 15, the exhaust hole 72 removes the solvent atmosphere discharged from the process space 10 and prevents the leakage of the solvent atmosphere to the outside of the housing 71. The exhaust hole 72 is connected to the tank 81 through a valve V7. In the front side of the housing, a transfer port 73 for transferring the wafer W to the process space 10 is formed.

The tank 81 is installed in a clean room and includes a front chamber 82, a back chamber 83, and a partition wall 84 for partitioning the front chamber 82 and the back chamber 83. A hole 85 for circulating air from the front chamber 82 to the back chamber 83 is formed above the partition wall 84. A liquid drain channel 82a is connected to the front chamber 82, and an exhaust mechanism 86 such as a vacuum pump is connected to the back chamber 83. The exhaust mechanism 86 is capable of performing the exhaust operation for respective parts of the substrate processing apparatus 1 through the tank 81 as described above. Cooling water paths 87 are formed at walls of the front chamber 82 and the partition wall 84 in the tank 81. Cooling water whose temperature is controlled by a temperature control unit (not shown) installed outside the tank 81 is fed to the cooling water paths 87, and then controlled by the temperature control unit and fed back to the cooling water paths 87.

The solvent, the dissolved resist material and the like, which were exhausted from the processing vessel 11 and the housing 71 and directed to flow into the front chamber 82, are cooled and liquefied in the front chamber 82, and then discharged through the liquid drain channel. Then, an atmosphere where the solvent and the dissolved resist material are removed is flown into the back chamber 83 and is exhausted. That is, the tank 81 serves to separate air and liquid and remove them. Further, since the solvent gas exhausted from the processing vessel 11 and the housing 71 is a gas of high temperature and high humidity, and is liquefied at a temperature of the clean room, e.g., about 23 degrees C., the solvent gas may be naturally cooled without forming cooling water paths 87. However, if cooling water paths 87 are formed, the separation of the gas and the liquid can be further improved. Instead of the cooling water, a temperature-controlled gas may be fed to the cooling water paths 87.

The substrate processing apparatus 1 may be controlled by the control unit 80. The control unit 80, for example, may be configured with a computer, and includes a program, a memory, and a Central Processing Unit (CPU). A command (each step), which allows the control unit 80 to provide a control signal to respective parts of the substrate processing apparatus 1 and allows predetermined surface treatment to be performed, may be stored in the program. The program is stored in a computer-readable storage medium, for example, a storage part such as a flexible disk, a compact disk, a hard disk, Magneto Optical (MO) disk, a memory card or the like, and installed in the control unit 80. Herein, the program may include a program for controlling the operations of opening/closing of each of the valves, increasing the temperature with the heaters 22 and 35, moving the cooling arm 51 and the exhaust arm 61, and elevating the elevating pins 23. The respective parts are controlled according to a predetermined process recipe stored in the memory of the control unit 80.

Hereinafter, a wafer process operation performed by the substrate processing apparatus 1, according to some embodiments, will be described with reference to FIGS. 6 to 16, which illustrate operations of respective parts of the substrate processing apparatus 1, and FIG. 17, which show a timing diagram for illustrating the operations of the respective parts of the substrate processing apparatus 1. The timing diagram represents the opening/closing operations of the transfer port 14 and the advance-retreat port 15 by the shutters 36 and 37, the advance/retreat operations of the cooling arm 51 and the exhaust arm 61 into/from the process space 10, ON/OFF operations of the supply and exhaust of gas for the respective parts, an elevation operation of the cover 13 and an elevation operation of the elevating pins 23.

Initially, the substrate processing apparatus 1 is in a state where: 1) the transfer port 14 is closed; 2) the cover 13 is positioned at an elevated position; 3) the advance-retreat port 15 is opened and the cooling arm 51 and the exhaust arm 61 are advanced into the process space 10; 4) the leading ends of the cooling arm 51 and the exhaust arm 61 are brought into contact with an internal wall of the processing vessel 11 to partition the exhaust section 50 surrounded by the exhaust arm 61 and the cooling arm 51 from the surrounding area. For the sake of simplicity, in the process space 10, the surrounding area of the exhaust section 50 defined as above may be referred as an adjacent section 60. After the exhaust section 50 is partitioned as above, exhausting the housing 71 through the exhaust hole 72 of the housing 71 and exhausting through the liquid-receiving portion 69 are performed.

Figure 6:
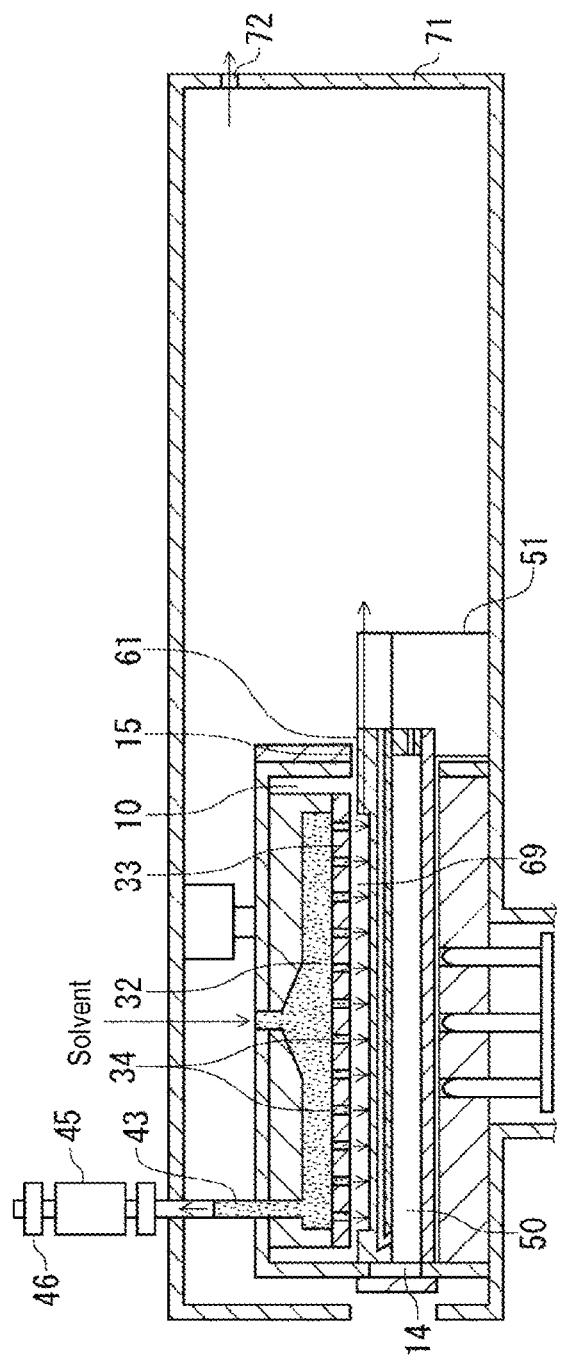
FIGS. 6 to 16 are schematic views illustrating operations of respective parts of the substrate processing apparatus, according to some embodiments.

Thereafter, the solvent is supplied from the solvent supply source 41 to the solvent supply region 32 and directed to flow into the liquid level detection pipe 43. Then, a liquid level of the solvent in the liquid level detection pipe 43 is gradually elevated as shown in FIG. 6. At this time, the solvent dropped through the solvent supply holes 34 is received in the liquid-receiving portion 69 and discharged therefrom. If the tank 45 is filled with the solvent and the upper liquid level detecting sensor 46 detects the liquid level of the solvent, the supply of the solvent to the solvent supply region 32 is stopped. The temperature of the stage 21 is increased by the heaters 22 and the lower surface of the solvent holding plate 33 is heated by the heaters 35 to a temperature lower than that of the stage 21, e.g., 40 degrees C. Then, the solvent is evaporated from the solvent supply holes 34 of the solvent holding plate 33 to form a solvent vapor, and the solvent evaporated from the solvent supply holes 34 is automatically supplied from the solvent supply region 32 to the solvent supply holes 34 by a capillary action.

After the solvent is supplied into the solvent supply region 32 and the liquid level detection pipe 43 as described above, the processing of the wafer W begins. As schematically illustrated in FIG. 17, the wafer W is subjected to a series of processes including: 1) transporting the wafer W into the process space 10; 2) controlling a temperature; 3) smoothing a resist mask with the solvent vapor; 4) cooling a processed wafer W; and 5) transporting the processed wafer W out of the process space 10.

Figure 7:
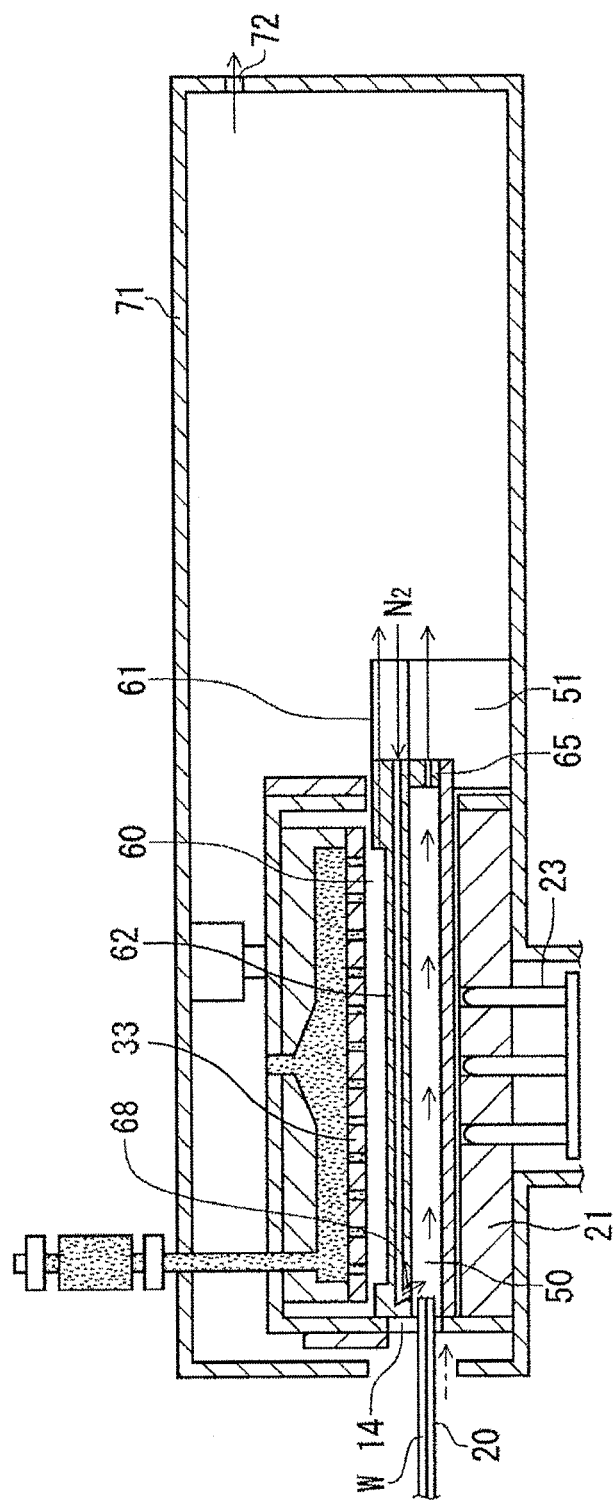

The N2 gas is discharged through the purge gas discharging hole 68 of the exhaust arm 61. At this time, the exhaust operation through the exhaust hole 65 is performed and a concentration of the solvent in the exhaust section 50, which is partitioned from the adjacent section 60, is decreased. Then, the transfer port 14 is opened and the exhaust section 50 is exposed to the outside of the processing vessel 11 (at time t1 in FIG. 17). Then, a transfer mechanism 20 advances into the exhaust section 50 while supporting a peripheral portion of the rear surface of the wafer W as shown in FIG. 7. The elevating pins 23 move upward to support the rear surface of the wafer W, and the transfer mechanism 20 is retreated from the processing vessel 11.

Figure 8:
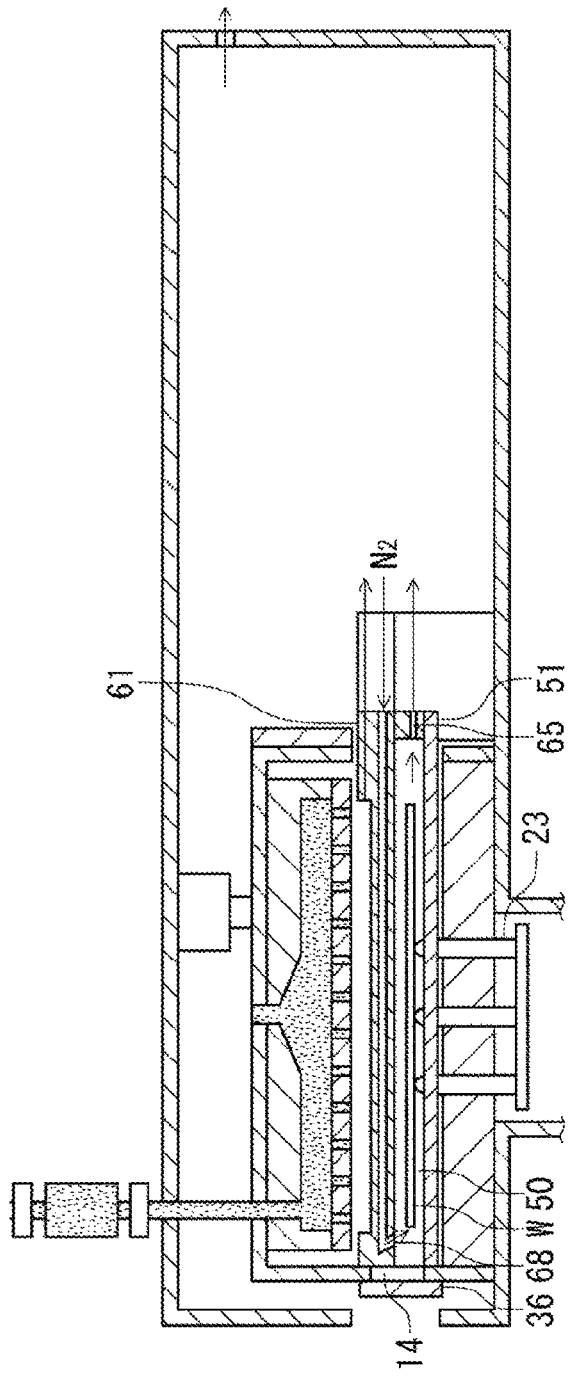
Figure 9:
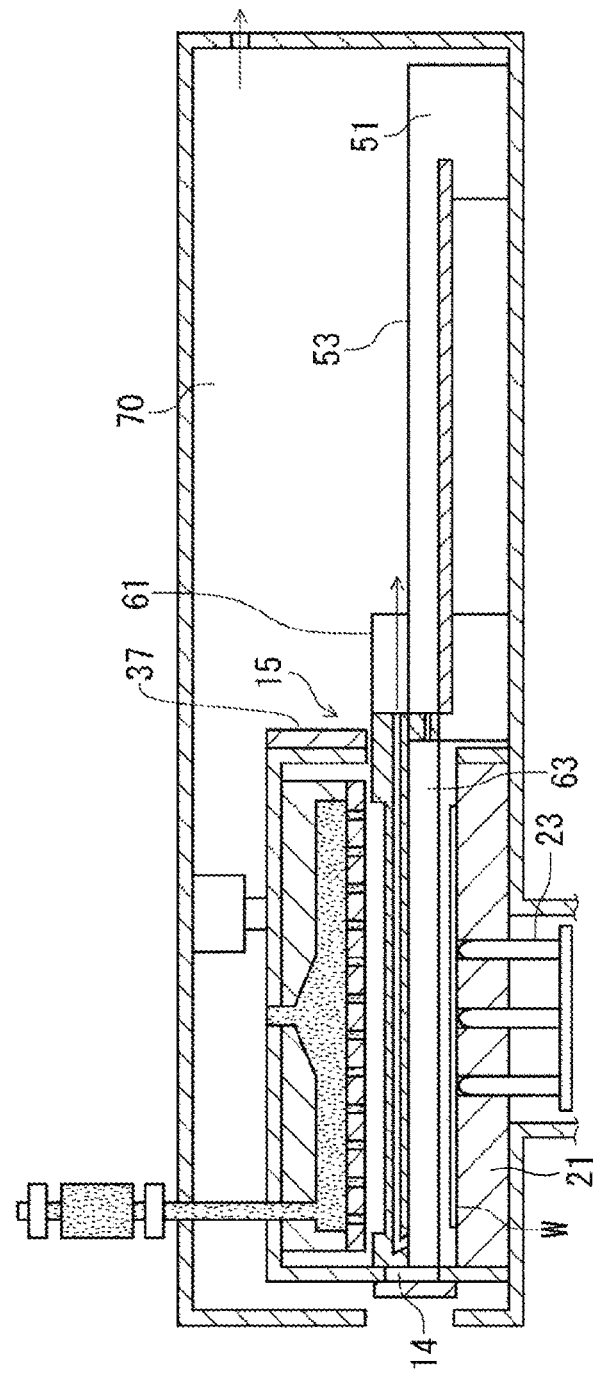
Figure 17:
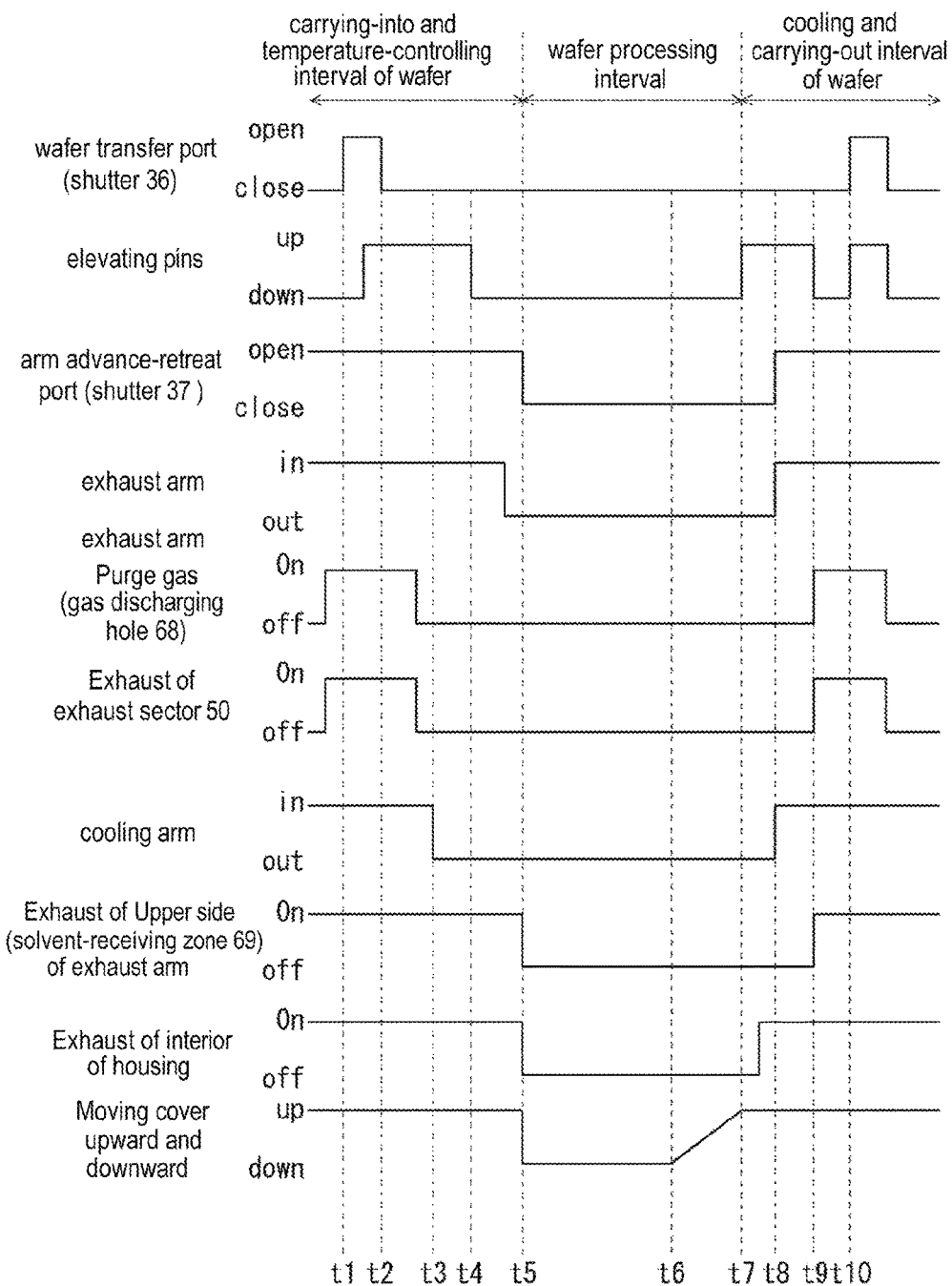
FIG. 17 is a timing diagram illustrating the operations of the respective parts of the substrate processing apparatus, according to some embodiments.

As shown in FIG. 8, the transfer port 14 is closed (at time t2 shown in FIG. 17). When the discharge of the N2 gas from the purge gas discharging hole 68 is stopped and the exhaust through the exhaust hole 65 is stopped, the cooling arm 51 is retreated to the standby section 70 (at time t3 shown in FIG. 17). Then, the elevating pins 23 move downward, and the wafer W is mounted on the stage 21 as shown in FIG. 9 (at time t4 shown in FIG. 17). At this time, the temperature of the wafer W is set equal to that of the clean room, e.g., 23 degrees C. The wafer W is heated by the heaters 22 of the stage 21 to a target temperature higher than a dew-point temperature of the solvent and lower than a boiling point of the solvent, e.g., 50 degrees C. The solvent holding plate 33 and the wafer W are partitioned by the exhaust arm 61 while the temperature of the wafer W rises, which prevents the solvent volatilized from the solvent holding plate 33 from being condensed and adhered to the wafer W before the volatilized solvent reaches to the target temperature. Accordingly, the wafer W can reach the target temperature while preventing excessive swelling.

Figure 10:
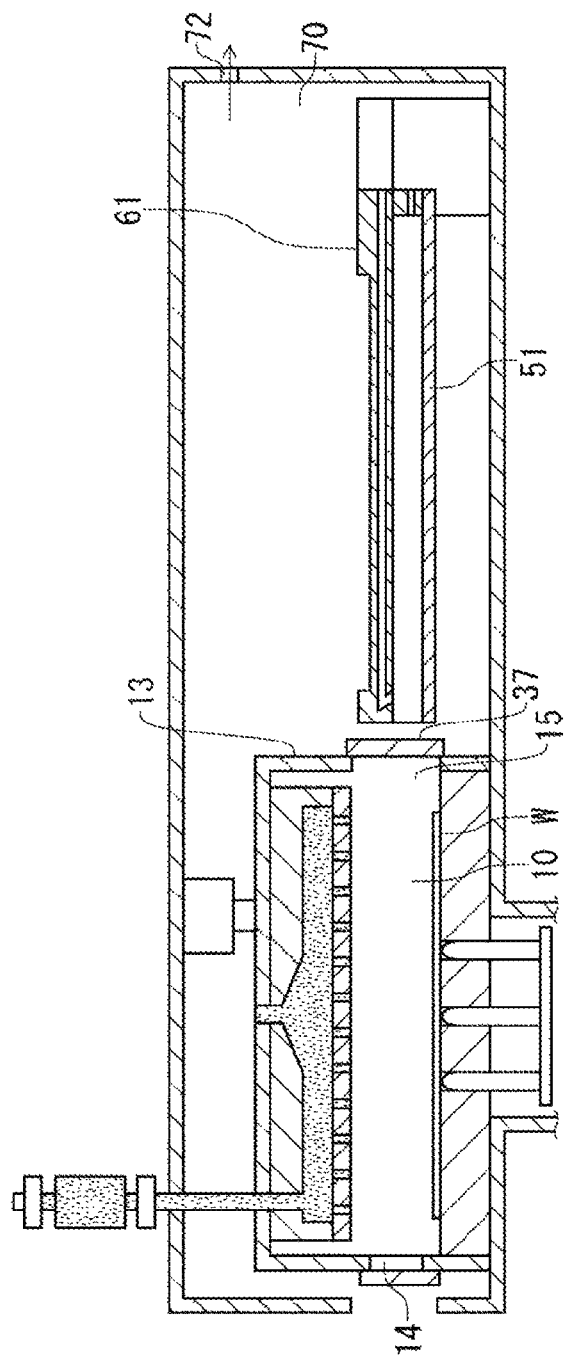
Figure 11:
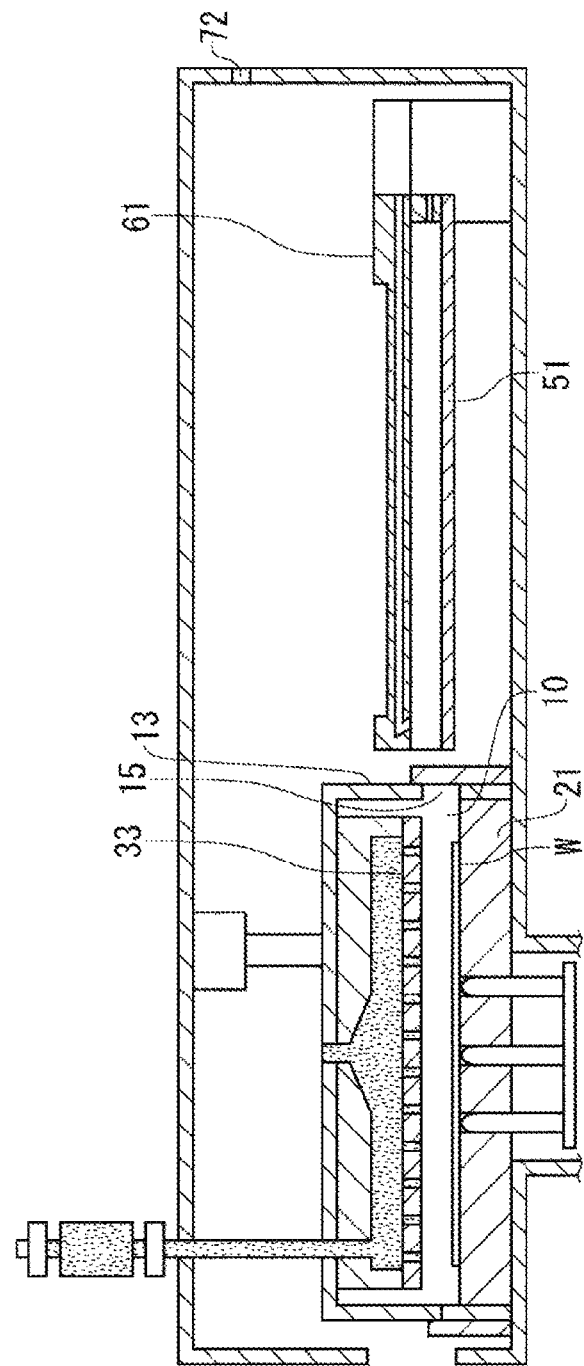

When the wafer W reaches the target temperature, the exhaust arm 61 is retreated to the standby section 70, and the advance-retreat port 15 is closed by the shutter 37. Then, the process space 10 is partitioned and closed from the standby section 70 as shown in FIG. 10, and the exhaust of the housing 71 through the exhaust hole 72 is stopped. Thereafter, the cover 13 of the processing vessel 11 descends to a process position as shown in FIG. 11 (at time t5 shown in FIG. 17). The solvent is volatilized from the solvent holding plate 33 into the process space 10, and the solvent becomes in equilibrium between the process space 10 and the surface of the solvent holding plate 33 and a saturated vapor atmosphere of the solvent is formed in the process space 10.

At this time, the wafer W is at a temperature adjusted to be higher than the dew-point temperature of the solvent and lower than the boiling point of the solvent. Accordingly, a phenomenon occurs in which molecules of the solvent crash against a resist pattern in the pattern mask 9 of the resist to thereby allow the surface of the pattern to be swollen by the solvent, but the solvent is again volatilized by heat of the wafer W repeatedly. As a result, as shown in upper and middle stages of FIG. 18, only a surface layer portion 91 of the pattern mask 9 absorbs the solvent to be swollen. Due to the solvent, molecules constituting the resist film are soften, dissolved and moved, but infiltration of the molecules into the pattern mask 9 is prevented. This prevents a shape of the pattern from being dissolved or deformed.

Figure 12:
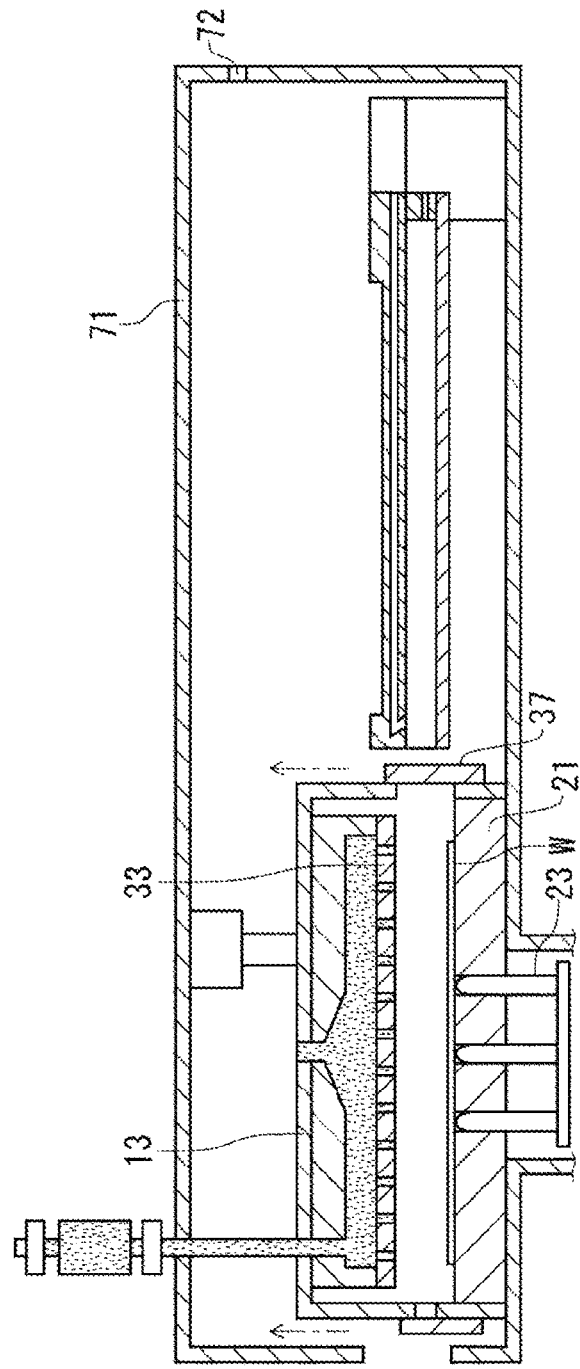
Figure 13:
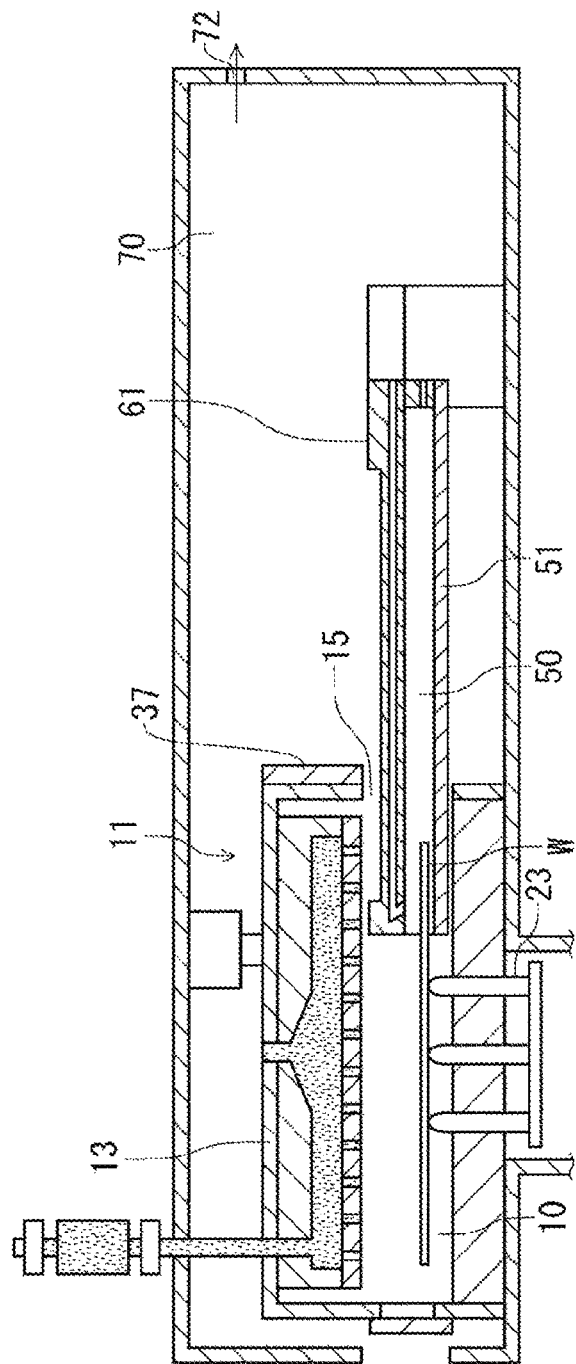
Figure 14:
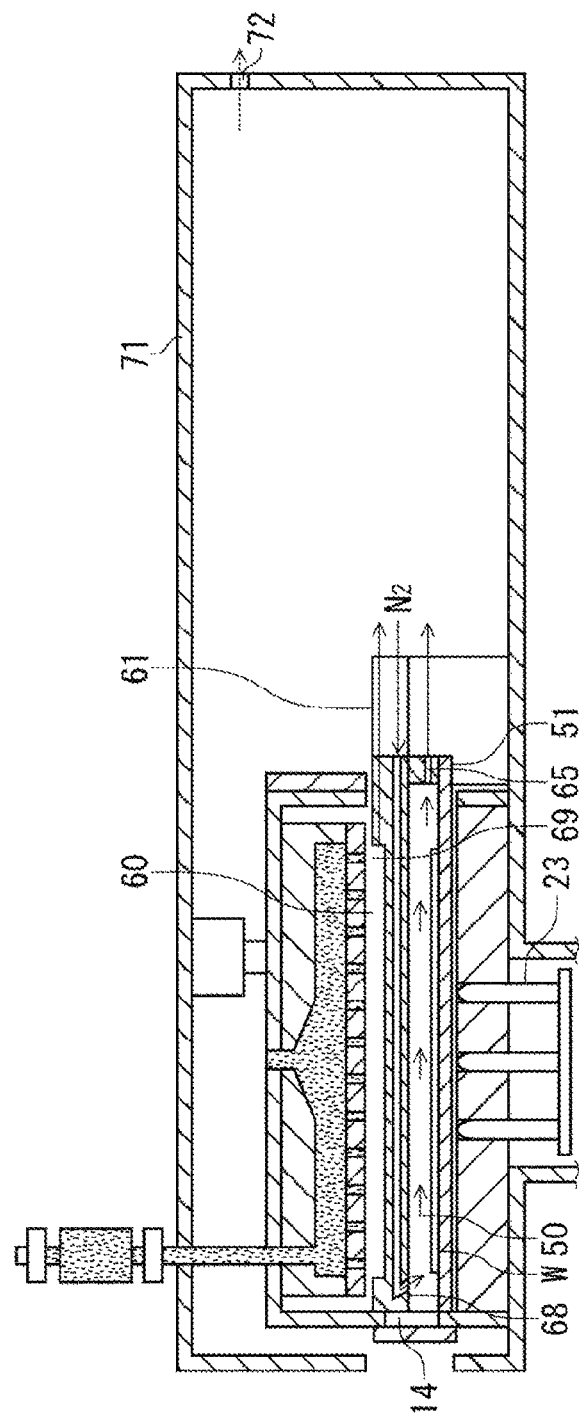

As shown in FIG. 12, the cover 13 begins to move upward (at time t6 shown in FIG. 17) and gradually returns to the elevated position before the cover 13 descends. As a result, a radiant heat to be received by the solvent holding plate 33 from the stage 21 and the wafer W is gradually reduced, a temperature of the solvent holding plate 33 is decreased, and an amount of the solvent vapor to be volatilized toward the process space 10 is also decreased. This suppresses an amount of the solvent vapor to be supplied to the wafer W and suppresses and prevents an excessive solvent from being supplied to the swollen surface layer portion 91. Therefore, the infiltration of the solvent to the inside of the pattern mask 9 is can be suppressed. By performing the aforementioned process, rough portions on the surface of the pattern mask 9 are smoothed and a variation of the line width of the pattern in the surface of the wafer W is decreased.

Figure 18:
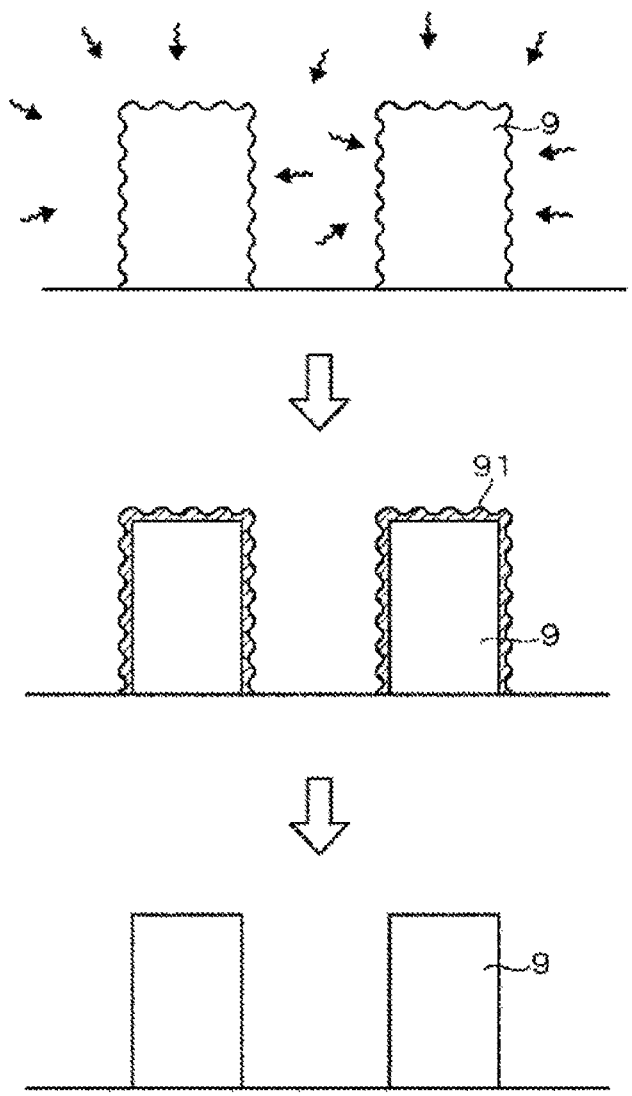
FIG. 18 is a schematic view showing a resist pattern formed on a substrate, according to some embodiments.

As shown in a lower stage of FIG. 18, the surface layer portion 91 of the pattern mask 9 begins to be dried, the cover 13 returns to the elevated position, the wafer W is raised from the stage 21 by the elevating pins 23 (at time t7 shown in FIG. 17), and the exhaust of the housing 71 through the exhaust hole 72 is resumed. Subsequently, the advance-retreat port 15 is opened, the cooling arm 51 and the exhaust arm 61 move into the process space 10 through the advance-retreat port 15 (at time t8 shown in FIG. 17), and the wafer W is enclosed in the exhaust section 50. The leading ends of the cooling arm 51 and the exhaust arm 61 are brought into contact with the internal wall of the processing vessel 11, and the exhaust section 50 is partitioned from the adjacent section 60 outside thereof.

Thereafter, the elevating pins 23 descend, and the wafer W is transferred to the cooling arm 51 and is cooled. While the elevating pins 23 descend as described above, as shown in FIG. 14, an exhaust operation is performed through the exhaust hole 65 of the exhaust arm 61. Additionally, a discharge of the N2 gas through the purge gas discharging hole 68 and an exhaust through the exhaust hole 65 are performed, and a gas stream from the forward side toward the backward side is formed in the exhaust section 50 (at time t9 shown in FIG. 17). As such, the exhaust operation and the purge gas supply operation are performed in the exhaust section 50 at a state when the exhaust section 50 is partitioned from the adjacent section 60 and where the solvent holding plate 33 used as a solvent supply source is installed such that the solvent is not introduced into the exhaust section 50, and the concentration of the solvent is quickly decreased.

Figure 15:
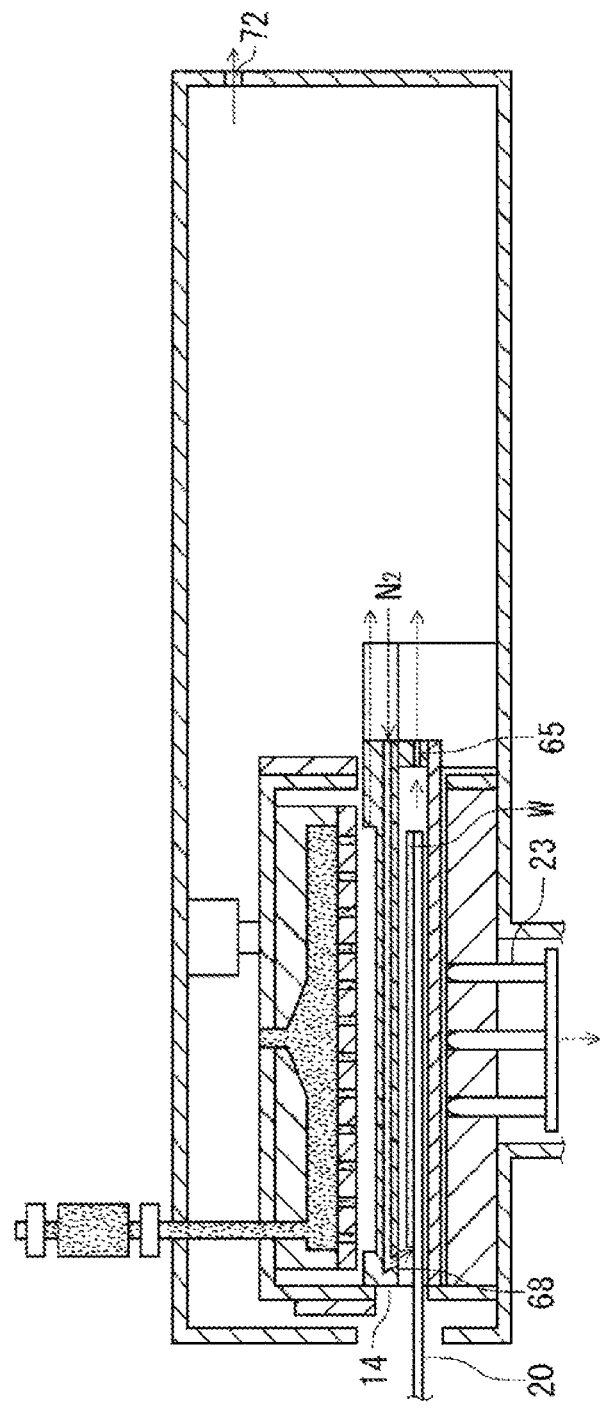

Thereafter, as shown in FIG. 15, the transfer port 14 is opened, the exhaust section 50 is exposed to the outside of the processing vessel 11, the elevating pins 23 is elevated to separate the wafer W from the cooling arm 51 (at time t10 shown in FIG. 17), the transfer mechanism 20 moves into the exhaust section 50, and the elevating pins 23 descend to transfer the wafer W on the transfer mechanism. The transfer mechanism 20 is retreated to carry out the wafer W. Even when the wafer W is carried out, the gas stream is continuously formed in the exhaust section 50, and thus the leakage of the solvent atmosphere from the exhaust section 50 to the outside of the processing vessel 11 is prevented or further reduced.

The transfer port 14 is closed, and the discharge of the N2 gas through the purge gas discharging hole 68 and the exhaust through the exhaust hole 65 are stopped. By the exhaust through the liquid-receiving portion 69 and the exhaust hole 72, the solvent vapor created from the solvent holding plate 33 is removed. Accordingly, the introduction of the solvent vapor into the exhaust section 50 is prevented. After the gas stream is formed in the exhaust section 50 and the solvent concentration of the exhaust section 50 is decreased, the transfer port 14 is opened and a subsequent wafer W is carried in the processing vessel 11. The next wafer W is processed in a similar manner as described for the previous wafer W and is carried out the processing vessel 11.

If the loading of the wafer W in the substrate processing apparatus 1 and the treatment process are continuously performed as described above, the tank 45 storing the solvent therein becomes empty and the liquid level of the solvent in the tank 45 is detected by the lower liquid level detecting sensor 44, the substrate processing apparatus 1 stops the treatment process for the wafer which is processed when the liquid level is detected and a solvent supplement operation is performed before transferring a next wafer W into the processing vessel 11. As shown in FIG. 6, such supplemental operation is performed similarly in the case where the solvent is supplied to the solvent supply region 32 at the start of the operation of the substrate processing apparatus 1. And, the solvent is supplied to the liquid level detection pipe 43 through the solvent supply region 32 until the upper liquid level detecting sensor 46 detects the liquid level of the solvent.

Figure 16:
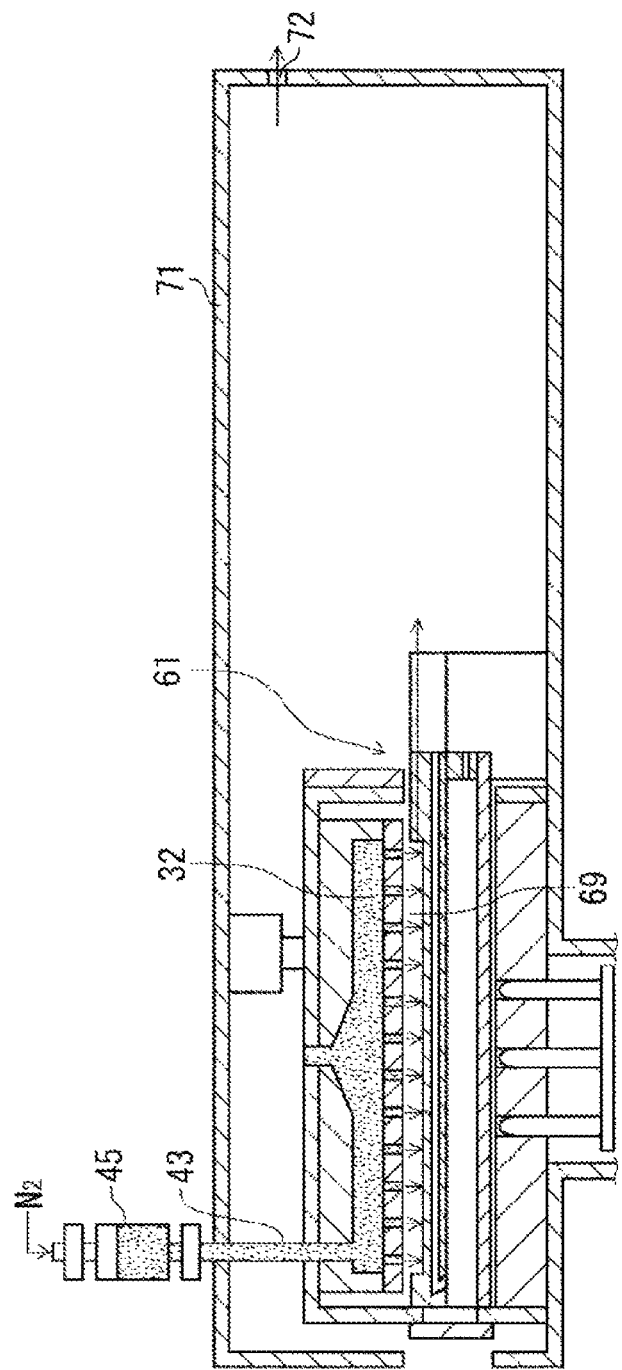

For example, when the operation of the substrate processing apparatus 1 is stopped after a predetermined number of wafers W are processed, the valve V3 is opened and the N2 gas is supplied to the liquid level detection pipe 43 as shown in FIG. 16. The solvent stored in the liquid level detection pipe 43, the tank 45 and the solvent supply region 32 is pressurized, and the solvent is forced from the solvent supply holes 34 of the solvent holding plate 33 into the liquid-receiving portion 69 of the exhaust arm 61 and then it is removed from the liquid-receiving portion 69. Thereafter, exhaust from the housing 71 through the exhaust hole 72, and exhaust/drain from the liquid-receiving portion 69 of the exhaust arm 61 are stopped.

In the substrate processing apparatus 1, in some embodiments, the exhaust arm 61 and the cooling arm 51 may be advanced to have the exhaust section 50 isolated from the surrounding area in the processing vessel 11 where a saturated vapor atmosphere of the solvent vapor is formed, and the exhaust section 50 is locally exhausted by the exhaust hole 65 of the exhaust arm 61. Thus, the solvent concentration of the exhaust section 50 can be quickly decreased. As a result, leakage of the solvent vapor from the transfer port 14, which is opened/closed with respect to the exhaust section 50, to the outside of the processing vessel 11 can be restrained. Further, since a volume of the exhaust section 50 relative to the process space 10 could be restrained, the solvent concentration of the exhaust section 50 can be quickly decreased and the processed wafer W can be quickly carried out and the subsequent wafer W can be quickly carried in with minimized effects due to the processing of the previous wafer W. As a result, the throughput is improved.

Further, since the substrate processing apparatus 1 is configured such that the heated wafer W is cooled by the cooling arm 51 during removing the solvent atmosphere of the exhaust section 50, it is not necessary to cool the wafer W after the wafer W is carried out from the substrate processing apparatus 1. Therefore, the throughput can be improved. In addition, the substrate processing apparatus 1 is advantageous in that the cooling arm 51 is provided to form the exhaust section 50 as described above. By this configuration, the exhaust section 50 is separated from a region of the lower side of the process space 10 and the volume of the exhaust section 50 can be reduced. However, the exhaust arm 61 is also provided to separate the process space 10 into upper and lower portions instead of the cooling arm 51, such that a section including the stage 21 in the lower side of the exhaust arm 61 may be defined as an exhaust section. In this case, it is preferable to restrain the volume of the exhaust section by controlling a gap between the exhaust arm 61 and the stage 21 and restraining the height of the exhaust section.

Further, the substrate processing apparatus 1 is configured such that the solvent is supplied to the lower surface of the solvent holding plate 33 in the processing vessel 11, and if the solvent is insufficient, the solvent is automatically supplied. Thus, it is not necessary to transfer the solvent holding plate 33 to the outside of the processing vessel 11 for supplying the solvent to the solvent holding plate 33. As a result, it is possible to prevent the solvent atmosphere from being drained to the outside of the substrate processing apparatus 1. Further, since there is no need to provide the transfer mechanism for transferring the solvent holding plate 33 to the outside of the processing vessel 11, it is possible to simplify the structure of the substrate processing apparatus 1 and to reduce manufacturing cost. The solvent holding plate 33 may be formed of a porous body.

In the above embodiments, the wafer W is carried in the process space 10 at a state where the temperature of the wafer W is at a temperature of the clean room, i.e., the temperature of the wafer W is lower than a temperature of the dew-point temperature of the solvent. However, the wafer W may be transferred to the process space 10 at a state when it is heated to a temperature that is higher than the dew-point temperature of the solvent. In this case, the temperature of the wafer W transferred to the stage 21 is decreased from the temperature when the wafer W is carried into the process space 10 to a temperature of the stage 21, i.e., to a target temperature, such that the pattern mask 9 is swollen in the saturated vapor atmosphere. That is, until the temperature of the wafer W is decreased from the temperature when the wafer W is carried into the process space 10 to the target temperature, no solvent molecules is adhered onto the wafer W and an excessive swelling of the pattern mask 9 can be further prevented.

Figure 19:
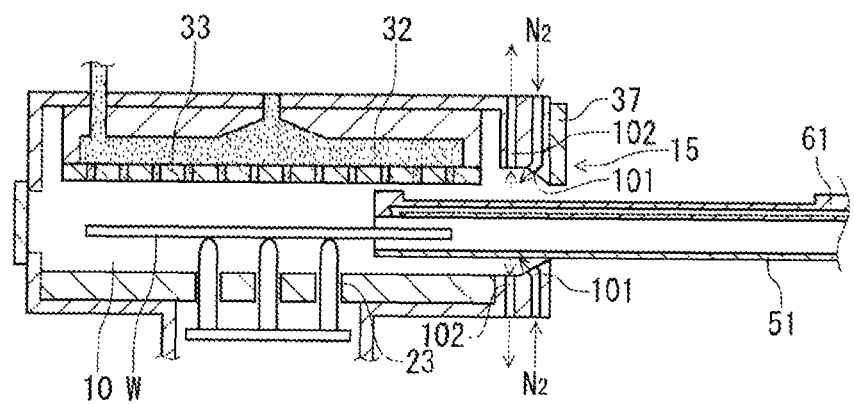
FIG. 19 shows a longitudinal sectional view of another configuration of a substrate processing apparatus, according to some embodiments.

The embodiment above is configured such that the interior of the housing 71 surrounding the processing vessel 11 is exhausted. Alternatively, a supply hole 101 and an exhaust hole 102 through which the N2 gas passes may be formed in the advance-retreat port 15 as shown in FIG. 19. When the shutter 37 is opened, the N2 gas is supplied through the supply hole 101, the exhaust operation is performed through the exhaust hole 102, and a gas stream is formed in the advance-retreat port 15 as indicated by an arrow in FIG. 19. With this configuration, the atmosphere of the process space 10 is obstructed by a gas stream, and leakage of the atmosphere of the process space 10 to the outside can be prevented.

Figure 20:
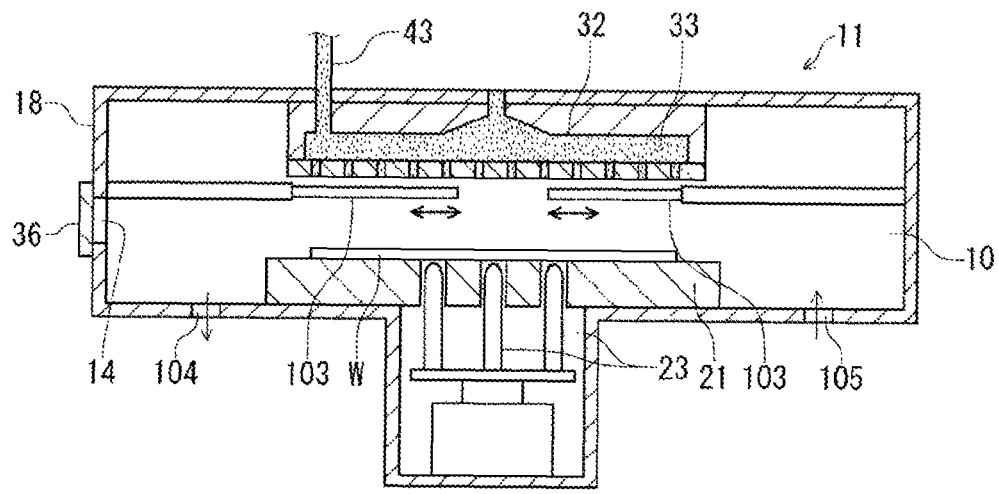
FIG. 20 shows a longitudinal sectional view of another configuration of a substrate processing apparatus, according to some other embodiments.

The embodiment above is configured such that the exhaust arm 61 used as a partition member is advanced into the process space 10 to define the process space 10, however the present disclosure is not limited thereto. For example, as shown in FIG. 20, openable/closable shutters 103 may be installed within the process space 10 to form the process space 10. In FIG. 20, a numerical number 104 represents an exhaust hole formed in the bottom portion of the processing vessel 11. After processing the wafer W, the shutter 103 is closed and the solvent holding plate 33 and the stage 21 on which the wafer W is mounted are partitioned. Then, the circumstance of the stage 21 is exhausted through the exhaust hole and the N2 gas is supplied through a gas supply hole 105, and thus an atmosphere of a lower side defined by being partitioning by the shutter 103 is displaced. Thereafter, the wafer W is carried out through the transfer port 14 and, and for example, it is transferred to a cooling device installed outside the processing vessel 11 and is cooled.

The embodiment above is configured such that the heaters 22 are built in the stage 21. However, any configuration may be used so long as the wafer W mounted on the stage 21 is heated. For example, a light emitting diode (LED) may be installed in the processing vessel 11 such that the LED radiates an optical energy to the wafer W for heating. Further, the above embodiment above is described that the N2 gas is supplied to respective parts of the substrate processing apparatus 1. However, the present disclosure is not limited thereto. For example, another gas such as air may be supplied to the respective parts. According to the embodiment of the present disclosure, a compartment mechanism for partitioning the process space from the solvent evaporation source formation part, and an exhaust hole for exhausting the interior of the compartmented section and a transfer hole for opening and closing the compartmented section are configured. Thus, when a substrate used as the wafer W is carried into and out the process space, it is possible to prevent the solvent generated from the solvent evaporation source formation part from being leaked outside the processing vessel. Further, since the volume of the partitioned section as an exhaust section inside the processing vessel is restrained, the exhaust section can be quickly exhausted, which makes it possible to carry a processed substrate out the processing vessel and to carry a subsequent substrate into the processing vessel. Therefore, it is possible to improve a throughput.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus to perform a predetermined process on a substrate on which a pattern mask is formed by exposure and development treatments, comprising:
    a processing vessel having a process space;
    a mounting table installed in the process space and configured to mount the substrate thereon;
    a heating part configured to heat the substrate mounted on the mounting table to a temperature higher than a dew-point temperature of a solvent;
    an evaporation source formation part installed in the process space, the evaporation source formation part configured to supply the solvent to process the substrate in a saturated vapor atmosphere of the solvent within the process space;
    a compartment mechanism configured to switch between a compartmented state and an open state,
    wherein the compartmented state includes a first section, which is a space between the evaporation source formation part and the compartment mechanism in the process space, and a second section, which is a space between the compartment mechanism and the mounting table in the process space,
    wherein, in the compartmented state, the first section and the second section are partitioned such that atmospheres of the first and second sections are blocked from each other, and
    wherein, in the open state, the atmospheres of the first and second sections are opened to each other;
    a substrate transfer hole formed in the processing vessel and configured to open and close with respect to the second section being in the compartmented state; and
    an exhaust hole formed to connect to the second section and configured to exhaust the second section in the compartmented state to remove a solvent atmosphere of the second section.

2. The substrate processing apparatus of claim 1, wherein the compartment mechanism is configured to move between the process space and a standby section outside the processing vessel, and
    wherein an openable/closable opening is formed in the processing vessel such that the compartment mechanism moves through the opening.

3. The substrate processing apparatus of claim 2, further comprising:
    a housing surrounding the standby section; and
    an outer exhaust hole for exhausting the housing.

4. The substrate processing apparatus of claim 2, further comprising:
    a cooling mounting part configured to mount and cool the substrate heated by the heating part, the cooling mounting part being further configured to move between the standby section and the process space; and
    a transfer mechanism configured to transfer the substrate from the mounting table to the cooling mounting part.

5. The substrate processing apparatus of claim 1, further comprising:
    an exhaust mechanism configured to discharge a unnecessary solvent from the evaporation source formation part, and
    wherein the compartment mechanism further comprises a liquid-receiving portion configured to discharge and remove the solvent.

6. The substrate processing apparatus of claim 1, wherein the exhaust hole is formed in the compartment mechanism.

7. The substrate processing apparatus of claim 1, wherein the compartment mechanism comprises a purge gas discharging hole through which a purge gas used in purging the solvent atmosphere of the second section to the exhaust hole for the removal is supplied to the second section.

8. The substrate processing apparatus of claim 1, wherein the evaporation source formation part includes an opposite portion that is formed to face the substrate and is provided with solvent supply holes opened toward the substrate,
    wherein the evaporation source formation part further comprises a solvent storing part in which the solvent is stored, and
    wherein the solvent is supplied from the solvent storing part to the solvent supply holes by a capillary action.

9. The substrate processing apparatus of claim 8, further comprising a sensor for detecting a level of the solvent remaining in the solvent storing part.

* * * * *